(12) United States Patent
Kim

(10) Patent No.: US 7,252,409 B2
(45) Date of Patent: Aug. 7, 2007

(54) BACKLIGHT UNIT

(75) Inventor: In Jue Kim, Ansan-si (KR)

(73) Assignee: LG.Philips LCD Co., Ltd., Seoul (KR)

( * ) Notice: Subject to any disclaimer, the term of this patent is extended or adjusted under 35 U.S.C. 154(b) by 42 days.

(21) Appl. No.: 11/312,447

(22) Filed: Dec. 21, 2005

(65) Prior Publication Data

US 2006/0291202 A1 Dec. 28, 2006

(30) Foreign Application Priority Data

Jun. 28, 2005 (KR) .................. 10-2005-0056477

(51) Int. Cl.
*F21V 29/00* (2006.01)

(52) U.S. Cl. .................. 362/294; 362/346; 362/228; 362/229

(58) Field of Classification Search .................. 362/23, 362/29, 235, 294, 346, 800, 228, 229, 260, 362/249, 252
See application file for complete search history.

(56) References Cited

U.S. PATENT DOCUMENTS

| | | | |
|---|---|---|---|
| 6,608,614 B1* | 8/2003 | Johnson | 345/102 |
| 6,762,562 B2* | 7/2004 | Leong | 315/51 |
| 6,853,151 B2* | 2/2005 | Leong et al. | 315/185 R |
| 7,192,160 B2* | 3/2007 | Reiff et al. | 362/231 |
| 2004/0222516 A1* | 11/2004 | Lin et al. | 257/712 |
| 2004/0233671 A1* | 11/2004 | Staufert | 362/294 |
| 2005/0157500 A1* | 7/2005 | Chen et al. | 362/294 |
| 2005/0265023 A1* | 12/2005 | Scholl | 362/229 |

* cited by examiner

*Primary Examiner*—Thomas M. Sember
(74) *Attorney, Agent, or Firm*—McKenna Long & Aldridge LLP

(57) ABSTRACT

A backlight unit of a hybrid structure is disclosed, to improve heat-sink efficiency, that includes a plurality of fluorescent lamps oriented in one direction inside a cover bottom; a metal PCB attached to an inner surface of the cover bottom; a plurality of LED lamps each positioned between the fluorescent lamps and on the metal PCB; a hole in a portion of the cover bottom that exposes a rear surface of the metal PCB; and a heat-sink plate directly attached to the metal PCB through the hole in the cover bottom.

12 Claims, 4 Drawing Sheets

BACKLIGHT UNIT

This application claims the benefit of Korean Patent Application No. P2005-56477, filed on Jun. 28, 2005, which is hereby incorporated by reference for all purposes as if fully set forth herein.

BACKGROUND OF THE INVENTION

1. Field of the Invention

The present invention relates to a backlight unit, and more particularly, to a backlight unit with a hybrid structure to improve heat-sink efficiency.

2. Discussion of the Related Art

The cathode ray tube (CRT) has been widely used as a display in televisions, measuring devices, and information terminals. However, the CRT cannot satisfy demands for miniaturization and light weight due to its inherent size and a weight. Thus, display devices such as a liquid crystal display (LCD) device using an electric field to cause an optical effect, a plasma display panel (PDP) using a gas discharge, and an electroluminescence display (ELD) device using an electric field luminous effect have been studied as a substitute for the CRT.

Among the display devices, the LCD device has been most actively studied, so the LCD device having beneficial characteristics such as compact size, light weight, and low power consumption have been highly developed for ultra-thin flat display devices, for example, monitors for spacecraft, aircraft, notebook computers, laptop computers, desktop computers, and large-sized display devices. That is, the demand for the LCD devices has continuously increased.

Generally, the LCD device includes an LCD panel for displaying a picture image and a driving device that applies a driving signal to the LCD panel. The LCD panel includes first and second glass substrates bonded to each other with a predetermined distance inbetween, and a liquid crystal layer formed between the first and second glass substrates.

The first glass substrate (TFT array substrate) includes a plurality of gate and data lines, a plurality of pixel electrodes, and a plurality of thin film transistors. At this time, the plurality of gate lines are formed on the first glass substrate at fixed intervals, and the plurality of data lines are formed substantially perpendicular to the plurality of gate lines at fixed intervals. Then, the plurality of pixel electrodes, which are arranged in a matrix configuration, are respectively formed in pixel regions defined by the plurality of gate and data lines crossing each other. The plurality of thin film transistors are switched according to signals on the gate lines to transmit signals of the data lines to the respective pixel electrodes.

The second glass substrate (color filter substrate) includes a black matrix layer that excludes light from regions except the pixel regions of the first substrate, a R(red)/G(green)/B(blue) color filter layer displaying various colors, and a common electrode to obtain the picture image.

Next, a predetermined space is maintained between the first and second glass substrates by spacers, and the first and second substrates are bonded to each other by a seal pattern having a liquid crystal injection inlet. Also, the liquid crystal layer is formed between the first and second glass substrates by injection of liquid crystal.

Meanwhile, the LCD device controls the transmittance of light to display the picture image. In this respect, the LCD device requires an additional light source such as a backlight unit. The backlight unit is classified into a direct-type method and an edge-type method according to a position of a lamp unit.

The LCD device uses a light source such as an Electro Luminescence (EL), a Light Emitting Diode (LED), a Cold Cathode Fluorescent Lamp (CCFL), or a Hot Cathode Fluorescent Lamp (HCFL).

In the edge-type method, the lamp unit is formed at one side of a light-guiding plate. The lamp unit includes a lamp, a lamp holder, and a lamp reflecting plate. The lamp is inserted into both sides of the lamp holder, whereby the lamp holder protects the lamp from an external impact. Also, the lamp reflecting plate reflects the light emitted from the lamp to the light-guiding plate.

Generally, the edge-type method of providing the lamp unit at one side of the light-guiding plate is applied to relatively small sized LCD devices such as the monitors for the laptop type computer or the desktop type computer. The edge-type method is useful to obtain uniform luminance, long lifetime and thin profile in the LCD device.

With the trend to large-sized LCD devices of 20-inches or more, the direct-type method has been developed, in which a plurality of lamps are formed in one line on a lower surface of a light-diffusion plate, whereby the entire surface of the LCD panel is directly illuminated with the light. The direct-type method, which has greater light efficiency as compared with that of the edge-type method, is used for large-sized LCD devices requiring high luminance.

Hereinafter, a related art backlight unit will be described with reference to the accompanying drawings.

FIG. 1 illustrates a perspective view of a backlight unit according to the related art. FIG. 2 illustrates a rear view of a backlight unit having a heat-sink plate according to the related art. FIG. 3 illustrates a cross sectional view, along I-I' of FIG. 1.

FIGS. 1, 2, and 3 illustrate a related art direct type backlight unit. The related art backlight unit includes a cover bottom 10, a plurality of fluorescent lamps 11, a metal PCB. 12, and a plurality of R/G/B LED lamps 13. At this time, the plurality of fluorescent lamps 11 are oriented in one direction inside the cover bottom 10. The metal PCB 12 adheres to an inner bottom of the cover bottom 10. The plurality of R/G/B LED lamps 13 are formed in one direction, wherein each of the LED lamps 13 is provided between the fluorescent lamps 11 or on the metal PCB 12. The metal PCB 12, on which the LED lamps 13 are mounted, is formed of aluminum which has great thermal conductivity.

In the above-mentioned backlight unit according to the related art, the fluorescent lamps 11 and the LED lamps 13 are formed together, which is referred to as a hybrid structure.

If using the LED lamps 13, it is necessary to provide a heat-sink plate because the LED lamps 13 emit a large amount of heat. Thus, if the heat-sink plate is not provided in the backlight unit using the LED lamps 13, the lifetime of backlight unit becomes shorter and the heat-sink efficiency of backlight unit is lowered.

In more detail, heat-sink plates 14 are formed at the rear side of the cover bottom 10, for emission of the heat generated from the fluorescent lamps 11 and the LED lamps 13. The heat-sink plates 14 adhere to a rear surface of the cover bottom 10 corresponding with the metal PCB 12. In this case, the heat generated from the fluorescent lamps 11 and the LED lamps 13 is transmitted to the outside through the metal PCB 12, the cover bottom 10, and the heat-sink plates 14.

If the heat-sink plates 14 directly adhere to the rear surface of the cover bottom 10, the cover bottom 10 serves as a heat resistance, whereby it is difficult to effectively transmit the heat to the outside.

SUMMARY OF THE INVENTION

Accordingly, the present invention is directed to a backlight unit that substantially obviates one or more problems due to limitations and disadvantages of the related art.

An advantage of the present invention is to provide a backlight unit with a hybrid structure to improve heat-sink efficiency.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a backlight unit includes a plurality of fluorescent lamps oriented in one direction inside a cover bottom; a metal PCB attached to an inner surface of the cover bottom; a plurality of LED lamps each positioned between the fluorescent lamps and on the metal PCB; a hole in a portion of the cover bottom that exposes a rear surface of the metal PCB; and a heat-sink plate directly attached to the metal PCB through the hole in the cover bottom.

In another aspect of the present invention, a method cooling a backlight unit includes: placing a plurality of fluorescent lamps inside a cover bottom; attaching a metal PCB to an inner surface of the cover bottom; placing a plurality of LED lamps each positioned between the fluorescent lamps and on the metal PCB; forming a hole in a portion of the cover bottom exposing a rear surface of the metal PCB; and attaching a heat-sink plate directly to the metal PCB through the hole in the cover bottom.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Hereinafter, a backlight unit according to the preferred embodiment of the present invention will be described with reference to the accompanying drawings.

Figure 1:
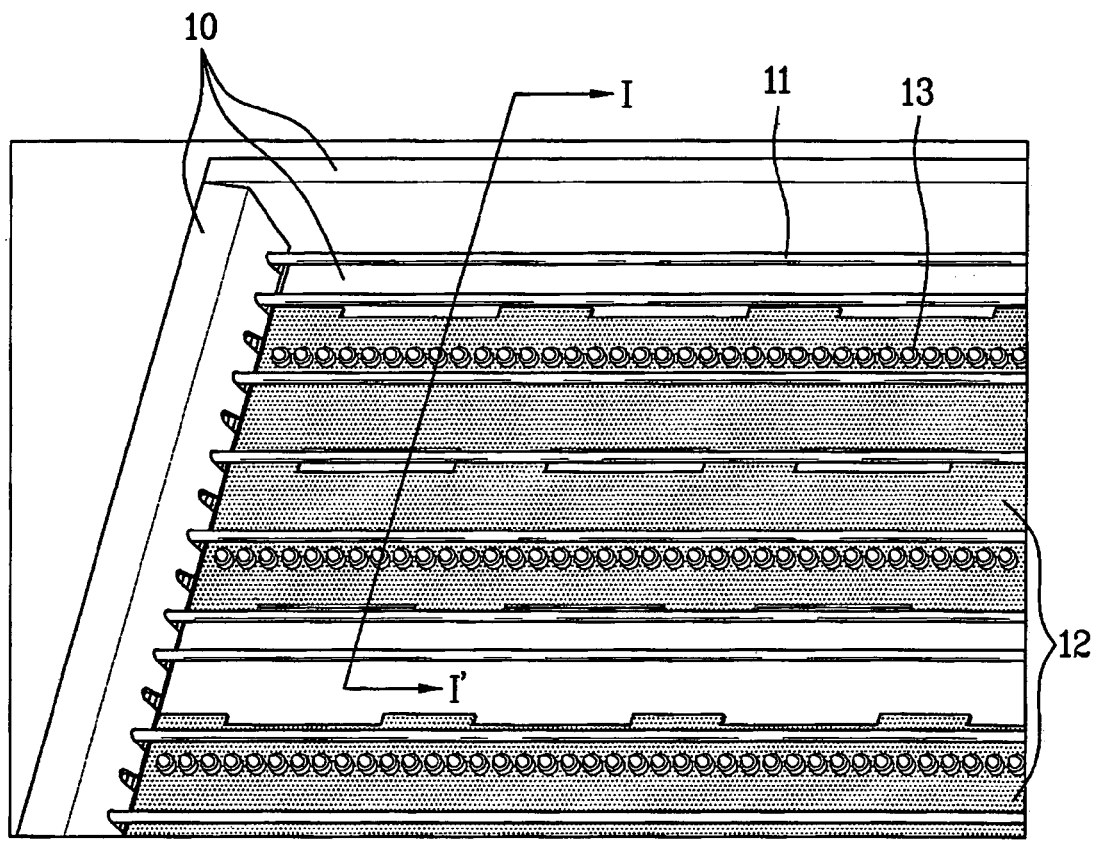
FIG. 1 illustrates a perspective view of some portions of a backlight unit according to the related art.
Figure 2:
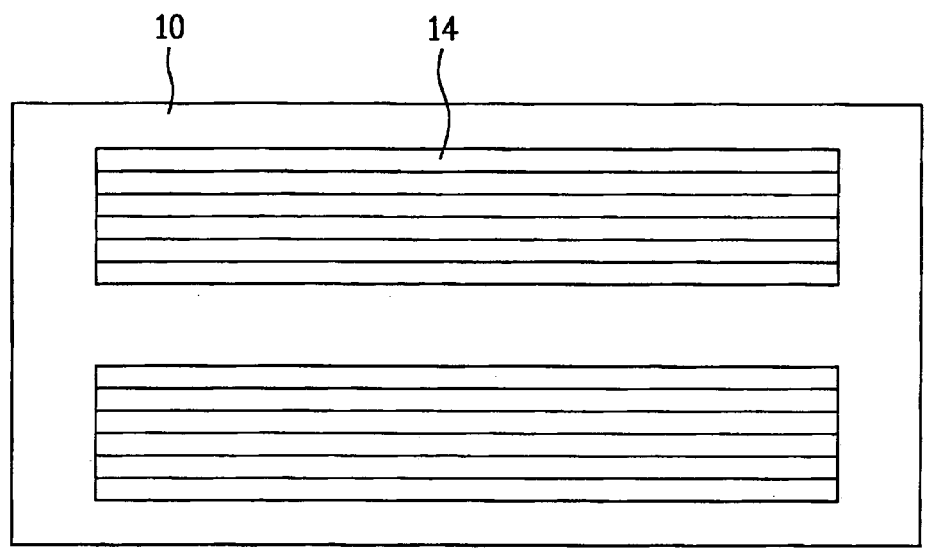
FIG. 2 illustrates a rear view of a backlight unit having a heat-sink plate according to the related art.
Figure 3:
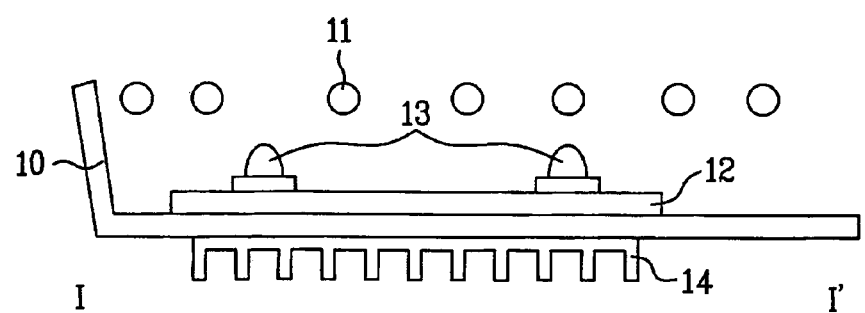
FIG. 3 illustrates a cross sectional view along I-I' of FIG. 1.
Figure 4:
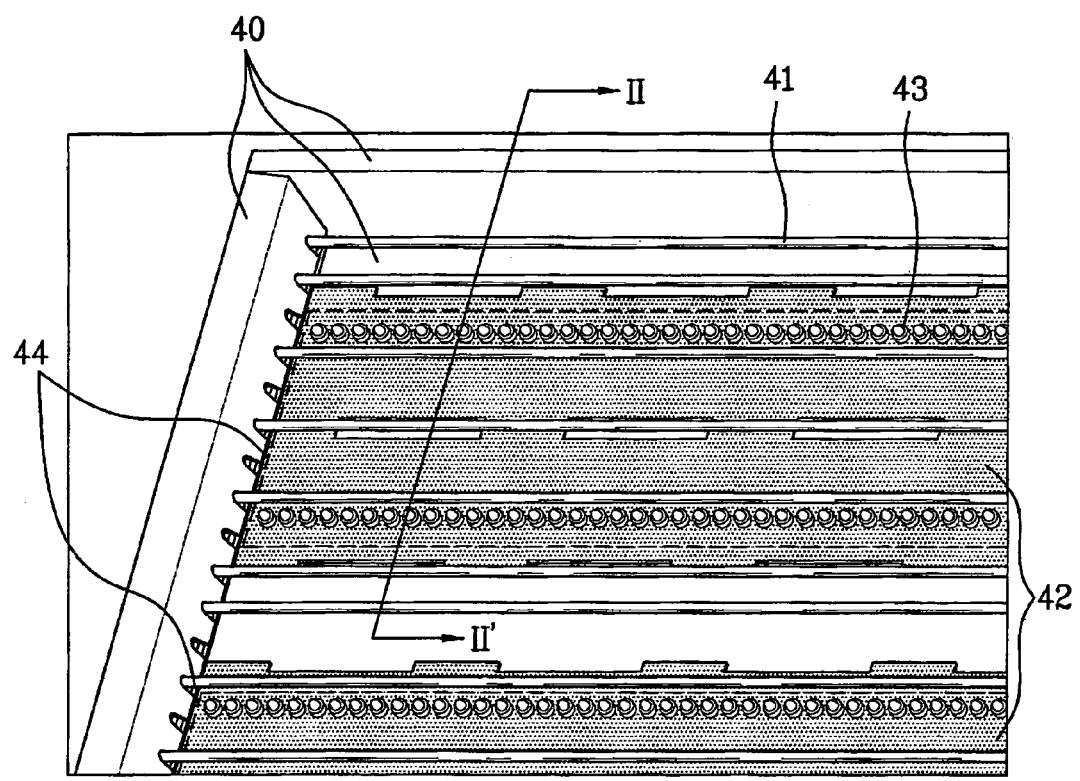
FIG. 4 illustrates a perspective view of some portions of a backlight unit according to the preferred embodiment of the present invention.
Figure 5:
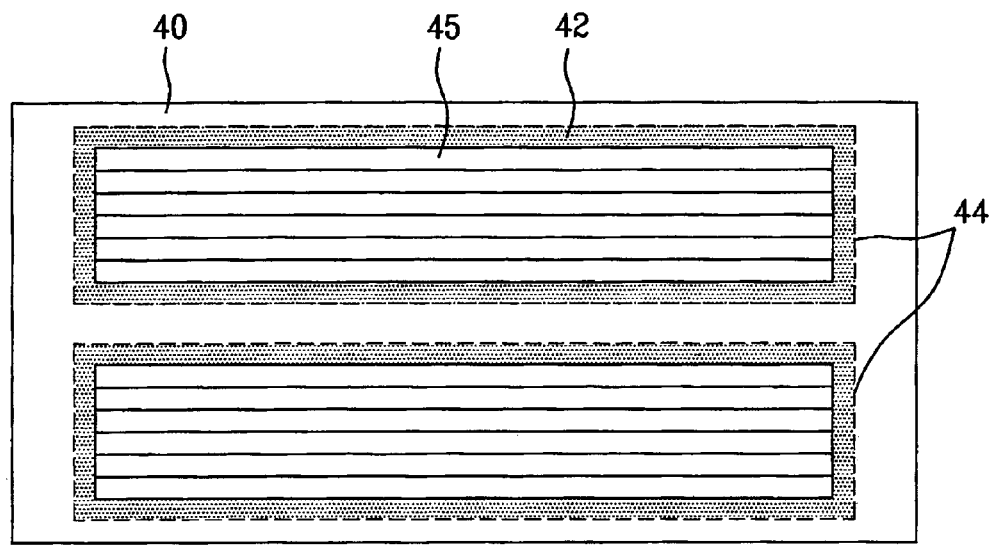
FIG. 5 illustrates a rear view of a backlight unit having a heat-sink plate according to the preferred embodiment of the present invention.
Figure 6:
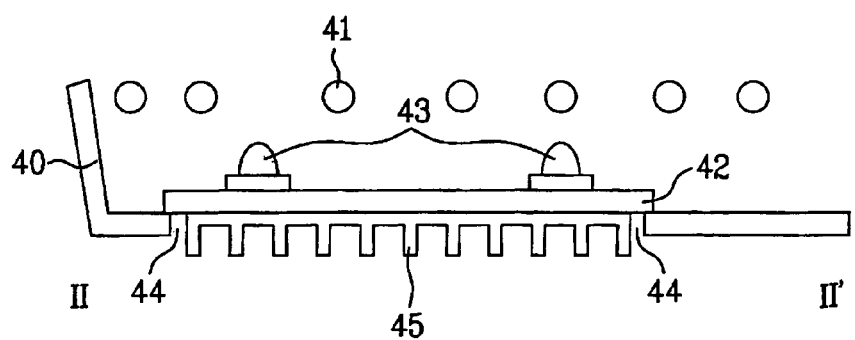
FIG. 6 illustrates a cross sectional view along II-II' of FIG. 4.

FIG. 4 illustrates a perspective view of some portions of a backlight unit according to the preferred embodiment of the present invention. FIG. 5 illustrates a rear view of a backlight unit having a heat-sink plate according to the preferred embodiment of the present invention. FIG. 6 illustrates a cross sectional view along II-II' of FIG. 4.

FIGS. 4, 5, and 6, illustrate a direct type backlight unit according to the preferred embodiment of the present invention. The backlight unit according to the preferred embodiment of the present invention includes a cover bottom 40, a plurality of fluorescent lamps 41, at least one of metal PCB 42, and a plurality of R/G/B LED lamps 43. The plurality of fluorescent lamps 41 are oriented in one direction inside the cover bottom 40. The metal PCB 42 adheres to an inner bottom of the cover bottom 40. The plurality of R/G/B LED lamps 43 are formed in one direction, wherein each of the LED lamps 43 is situated between the fluorescent lamps 41 and on the metal PCB 42. The metal PCB 42, on which the LED lamps 43 are mounted, is formed of aluminum which has great thermal conductivity.

Although not shown, both ends of the respective fluorescent lamps 41 are fixed to the cover bottom 40 by holders. The fluorescent lamps 41 may be formed of cold cathode fluorescent lamps CCFLs or external electric fluorescent lamps EEFLs.

When the above-mentioned backlight unit is applied to an LCD device, a light-scattering means may be additionally formed above the fluorescent lamps 41 and the LED lamps 43. The light-scattering means prevents the silhouette of the fluorescent lamps 41 and the LED lamps 43 from being shown on a display surface of an LCD panel (not shown), and provides a light source with uniform luminance. The light-scattering means may be provided with a plurality of diffusion sheets and one diffusion plate, for improvement of the light-scattering efficiency.

Also, a reflecting plate is provided on an inner surface of the cover bottom 40 and the metal PCB 42 except where the LED lamps 43 are. The reflecting plate reflects the light emitted from the fluorescent lamps 41 and the LED lamps 43 upward, thereby maximizing the light efficiency.

The backlight unit using the fluorescent lamps 41 and the LED lamps 43 together is referred to as a hybrid backlight unit.

When using the LED lamps 43, it is necessary to provide a heat-sink plate 45 to transmit the heat generated from the LED lamps 43 to the outside. If the heat-sink plate is not provided in the backlight unit using the LED lamps 43, the lifetime of backlight unit becomes shorter and the heat-sink efficiency of backlight unit is lowered.

To mount the heat-sink plate, one or more holes 44 are formed in a predetermined portion of the cover bottom 40, wherein the holes expose a rear surface of the metal PCB 42 having the LED lamps 43 mounted thereon. The hole 44 may have the same size as the heat-sink plate 45 or may be larger in size than the heat-sink plate 45.

In the backlight unit according to the preferred embodiment of the present invention, the heat-sink plate 45 directly adheres to the metal PCB 42 so as to transmit the heat generated from the fluorescent lamps 41 and the LED lamps 43 to the outside through the holes 44.

If the heat-sink plate 45 directly adheres to the metal PCB 42, the heat generated from the fluorescent lamps 41 and the LED lamps 43 is transmitted to the outside through the metal PCB 42 and the heat-sink plate 45 without passing through the cover bottom 40. Thus, it is possible to shorten the heat transmission path. Also, the metal PCB 42 is exposed to the outside, whereby it is possible to lower the temperature of the metal PCB 42, thereby improving the effect of heat transmission.

Also, the heat-sink plate 45 includes a plurality of partition walls, for maximization of heat-transmission surfaces.

As mentioned above, the backlight unit according to the present invention has the following advantages.

In the backlight unit according to the present invention, the heat-sink plate directly adheres to the rear surface of the metal PCB, so that it is possible to shorten the heat transmission path. Also, the metal is directly exposed to the outside, whereby the temperature of the metal PCB is lowered.

Thus, it is possible to improve the heat-sink efficiency and light-emission efficiency in the backlight unit according to the present invention.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A backlight unit comprising:
   a plurality of fluorescent lamps oriented in one direction inside a cover bottom;
   a metal PCB attached to an inner surface of the cover bottom;
   a plurality of LED lamps each positioned between the fluorescent lamps and on the metal PCB;
   a hole in a portion of the cover bottom that exposes a rear surface of the metal PCB; and
   a heat-sink plate directly attached to the metal PCB through the hole in the cover bottom.

2. The backlight unit of claim 1, wherein a size of the hole is greater than or equal to a size of the heat-sink plate.

3. The backlight unit of claim 1, wherein the metal PCB is formed of aluminum.

4. The backlight unit of claim 1, further including a reflecting plate formed on an inner surface of the cover bottom and the metal PCB except where the LED lamps are located.

5. The backlight unit of claim 1, further including a plurality of diffusion sheets and one diffusion plate provided above the fluorescent lamps and the LED lamps to provide a light source with uniform luminance.

6. The backlight unit of claim 1, further including a plurality of metal PCBs, a plurality of holes in the cover bottom, and a plurality of heat sink plates directly attached to the plurality of metal PCBs.

7. A method cooling a backlight unit comprising:
   placing a plurality of fluorescent lamps inside a cover bottom;
   attaching a metal PCB to an inner surface of the cover bottom;
   placing a plurality of LED lamps each positioned between the fluorescent lamps and on the metal PCB;
   forming a hole in a portion of the cover bottom exposing a rear surface of the metal PCB; and
   attaching a heat-sink plate directly to the metal PCB through the hole in the cover bottom.

8. The method of claim 7, wherein a size of the hole is greater than or equal to a size of the heat-sink plate.

9. The method of claim 7, wherein the metal PCB is formed of aluminum.

10. The method of claim 7, further including attaching a reflecting plate on an inner surface of the cover bottom and metal PCB except where the LCD lamps are located.

11. The method of claim 7, further including placing a plurality of diffusion sheets and one diffusion plate above the backlight unit.

12. The method of claim 7, further including attaching a plurality of metal PCBs to an inner surface of the cover bottom;
   forming a plurality of holes in the cover bottom exposing rear surfaces of the plurality of metal PCBs; and
   attaching a plurality of heat-sink plates directly to the plurality of metal PCBs through the plurality of holes in the cover bottom.

* * * * *